(12) United States Patent
Li et al.

(10) Patent No.: US 11,977,825 B2
(45) Date of Patent: May 7, 2024

(54) DISCRETE ELEMENT METHOD (DEM) CONTACT MODEL BUILDING METHOD FOR REFLECTING WEAKENING OF SEEPAGE ON ROCK AND SOIL MASS STRENGTH

(71) Applicant: SHANDONG UNIVERSITY, Shandong (CN)

(72) Inventors: Shucai Li, Jinan (CN); Zongqing Zhou, Jinan (CN); Liping Li, Jinan (CN); Weimin Yang, Jinan (CN); Chunjin Lin, Jinan (CN); Shaoshuai Shi, Jinan (CN); Chenglu Gao, Jinan (CN); Chengshun Shang, Jinan (CN); Yang Geng, Jinan (CN); Songsong Bai, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 594 days.

(21) Appl. No.: 17/299,100

(22) PCT Filed: Oct. 23, 2020

(86) PCT No.: PCT/CN2020/123300
§ 371 (c)(1),
(2) Date: Jun. 2, 2021

(87) PCT Pub. No.: WO2021/135553
PCT Pub. Date: Jul. 8, 2021

(65) Prior Publication Data
US 2022/0318462 A1  Oct. 6, 2022

(30) Foreign Application Priority Data
Dec. 31, 2019  (CN) .......................... 201911414054.1

(51) Int. Cl.
*G06F 30/25* (2020.01)
(52) U.S. Cl.
CPC ................................ *G06F 30/25* (2020.01)

(58) Field of Classification Search
CPC ..................................................... G06F 30/25
See application file for complete search history.

(56) References Cited

U.S. PATENT DOCUMENTS
2018/0355701 A1   12/2018   Dutko et al.

FOREIGN PATENT DOCUMENTS
CN    104535470 A    4/2015
CN    107818229 A    3/2018
(Continued)

OTHER PUBLICATIONS

Xiong Z, Wang M, Shi S, Xia Y, Lu H, Bu L. Water inrush analysis of the Longmen Mountain Tunnel based on a 3D simulation of the discrete fracture network. Open Geosciences. Dec. 29, 2017;9(1):650-62. (Year: 2017).*

(Continued)

*Primary Examiner* — Chuen-Meei Gan
(74) *Attorney, Agent, or Firm* — Oliff PLC

(57) ABSTRACT

A discrete element method contact model building method includes: selecting a filling body in a disaster-causing structure to obtain a change rule of cumulative loss of the filling body; performing test simulation, and determining a relation function of each group of corresponding mesoscopic mechanical parameters in each time period and mesoscopic parameters of a DEM contact model representing a change rule of macroscopical parameters of the filling body; embedding each mesoscopic parameter relation function into an existing particle contact model, performing test simulation, and updating a fracture failure criterion of the contact model according to a corresponding relation of macro-mesoscopic strength during model failure; and based on a seepage failure indoor test, building a seepage failure discrete element calculation model, and simulating the seepage failure process of a rock and soil mass by using the obtained particle contact model and the fracture criterion of the particle contact model.

6 Claims, 3 Drawing Sheets

(56) References Cited

FOREIGN PATENT DOCUMENTS

| CN | 108763650 A | 11/2018 |
|---|---|---|
| CN | 109612885 A | 4/2019 |
| CN | 111024588 A | 4/2020 |

OTHER PUBLICATIONS

Shi S, Xie X, Bu L, Li L, Zhou Z. Hazard-based evaluation model of water inrush disaster sources in karst tunnels and its engineering application. Environmental earth sciences. Feb. 2018;77:1-3. (Year: 2018).*

Yang W, Fang Z, Yang X, Shi S, Wang J, Wang H, Bu L, Li L, Zhou Z, Li X. Experimental study of influence of karst aquifer on the law of water inrush in tunnels. Water. Sep. 7, 2018;10(9):1211. (Year: 2018).*

Shi S, Bu L, Li S, Xiong Z, Xie X, Li L, Zhou Z, Xu Z, Ma D. Application of comprehensive prediction method of water inrush hazards induced by unfavourable geological body in high risk karst tunnel: a case study. Geomatics, Natural Hazards and Risk. Dec. 15, 2017;8(2):1407-23. (Year: 2017).*

Jan. 18, 2021 International Search Report issued in International Patent Application No. PCT/CN2020/123300.

Jan. 18, 2021 Written Opinion issued in International Patent Application No. PCT/CN2020/123300.

Cheng, Kuang et al., "Determination of microscopic parameters of quartz sand through tri-axial test using the discrete element method" Computers and Geotechnics, vol. 92, pp. 22-40, 2017.

\* cited by examiner

DISCRETE ELEMENT METHOD (DEM) CONTACT MODEL BUILDING METHOD FOR REFLECTING WEAKENING OF SEEPAGE ON ROCK AND SOIL MASS STRENGTH

BACKGROUND

Technical Field

The present invention belongs to the field of underground engineering, and particularly relates to a discrete element particle contact model building method for describing continuous weakening of seepage on rock and soil mass strength in a tunnel water inrush process.

Related Art

The water inrush disaster caused by highly rich water, component structure, strong karst and high ground stress is one of the main threats of western mountain tunnel engineering construction with steep terrain, deep canyon, karst development and extremely complex geological structures in China. The seepage failure type water inrush has the characteristics of great flow, high burstiness, strong destructiveness and the like. Once disaster occurs, serious casualties, economic losses and construction period delay will be caused. Because the dynamic evolution process of the water inrush is extremely complicated, an effective numerical analysis model for accurate description of a seepage failure water inrush catastrophe process has not been formed at home and abroad.

Continuous medium numerical analysis methods commonly used in the field of geotechnical engineering at present mainly include a finite difference method, a finite element method and a boundary element method. These methods are all based on the assumption of isotropic small deformation of a continuous medium, but a rock and soil mass is an anisotropic body with a large number of discontinuous interfaces such as joint fissures inside, so that the discontinuous problem of geotechnical engineering is difficult to solve with the above methods.

Compared with the continuous medium numerical analysis method, a discrete element method adopts a basic idea of regarding the whole medium as a structure consisting of a series of discrete particles and performing mechanical analysis on the problem on the basis of the force-displacement law and the Newton second motion law, and thus has incomparable advantages in simulating the seepage failure of a rock and soil medium material.

However, a contact model of the discrete element method (DEM) can only reflect the basic mechanical characteristics of the rock and soil mass under a certain condition, and is difficult to reflect an evolution rule of the mechanical properties in a disaster occurrence process. By taking a tunnel seepage failure water inrush catastrophe evolution process as an example, the erosion of seepage to the rock and soil mass causes the shear strength to nonlinearly reduce along with the loss of cohesive soil or fine particles, but the bonding strength in an existing discrete element particle contact model is set to be fixed without considering the nonlinear reduction process of the bonding strength under the seepage of underground water. Therefore, the strength weakening problem of the filling body in the seepage failure evolution process cannot be truly simulated by using the existing model.

SUMMARY

By aiming at the problem that an existing discrete element numerical simulation method is difficult to realize simulation of weakening of internal strength of a rock and soil mass, the present invention provides a discrete element particle contact model building method capable of describing continuous weakening of underground water seepage on rock and soil mass strength, and provides a reasonable and accurate calculation model for simulation of a seepage failure evolution process of a filling body.

In order to achieve the above objective, the present invention uses the following technical solution:

A discrete element particle contact model building method for describing continuous weakening of underground water seepage on rock and soil mass strength includes the following steps:

step 1: selecting a typical filling body in a disaster-causing structure such as a fault, a crushed zone and strong weathered slot, and preparing the typical filling body into a standard sample of a rock and soil mechanical test, and performing a seepage failure indoor test under the action of a constant water pressure to obtain a change rule of cumulative loss of the filling body along with time under the action of seepage;

step 2: performing a screening test on the filling body flowing out in each time period in step 1 to measure the grading of the filling body flowing out and further obtain each grading specific weight of the rest filling body, then, preparing a sample again according to the grading of the filling body after the loss in each time period, respectively performing triaxial compression and shearing mechanical tests, and measuring mechanical parameters such as a shear strength $\tau$, a compression strength $\sigma$, an elastic modulus E, cohesive force c and an internal friction angle $\varphi$ of the sample in each time period to further obtain a change rule of mechanical parameters of the filling body along with the loss of the filling body;

step 3: according to the change rule of the loss of the filling body measured in step 1 and the change rule of the macroscopical mechanical parameters ($\tau$, $\sigma$, E, c and $\varphi$) of the filling body in each time period along with the loss of the filling body measured in step 2, performing uniaxial tension, triaxial compression and shearing mechanical test simulation by using DEM software, performing macro-mesoscopic parameter calibration based on macroscopical mechanical parameters of the filling body in each time period, and finally determining each group of mesoscopic mechanical parameters corresponding to each time period; and respectively performing function fitting on the value of each mesoscopic parameter in each time period to reveal the relation between the macroscopic mechanical parameters of the filling body and the mesoscopic parameters of a discrete element contact model, and further obtain a relation function of mesoscopic parameters of a DEM contact model capable of representing the change rule of the macroscopic mechanical parameters of the filling body;

step 4: through secondary development of the DEM software contact model, embedding each mesoscopic parameter relation function built in step 3 into an existing particle contact model, performing uniaxial compression and triaxial compression test simulation, and updating a fracture failure criterion of the contact model according to a corresponding relation of macro-mesoscopic strength during model failure, so as to realize the simulation of the continuous weakening process of filling body strength; and step 5: based on a seepage failure indoor test, building a seepage failure discrete element calculation model, and simulating the seepage failure process of a rock and soil mass by using the particle contact model and the fracture criterion of the particle contact model obtained in step 4.

Further, in step 1, at certain time intervals $\Delta t_i$, the filling body flowing out in the test process is collected, dried and weighed, and the mass of the filling body flowing out in each time period is separately weighed. Along with time accumulation, the mass of the filling body flowing out in the test process is added to obtain the total mass of the filling body flowing out. The change rule of the cumulative loss of the filling body along with the time under the action of seepage is further obtained.

Further, a simulation result is compared with a seepage failure indoor test result, and the accuracy of the built model is determined by macro-mesoscopic failure mode and mechanical parameter comparison. If a matching degree of the simulation result and the indoor test result is low, the operation goes to step 3 to obtain the relation function of the mesoscopic mechanical parameters of the DEM contact model capable of representing the change rule of the macroscopical mechanical parameters of the filling body again; and if the matching degree of the simulation result and the indoor test result is high, the simulation result is able to be better matched with the indoor test result by finely adjusting the mesoscopic parameters, so as to testify the feasibility and accuracy of the strength weakening simulation of the contact model.

The present invention has the following beneficial effects:

Based on the existing discrete element contact model, the present invention provides a novel contact model with contact bonding strength between particles changing non-linearly along with time. The model considers the continuous weakening of seepage on bonding strength between the particles, and can more truly simulate a catastrophe evolution process of tunnel filling body seepage failure water inrush.

BRIEF DESCRIPTION OF THE DRAWINGS

The accompanying drawings constituting a part of the present invention are used for providing further understanding for the present invention. Exemplary embodiments of the present invention and descriptions thereof are used for explaining the present invention and do not constitute any inappropriate limitation to the present invention.

DETAILED DESCRIPTION

Figure 1:
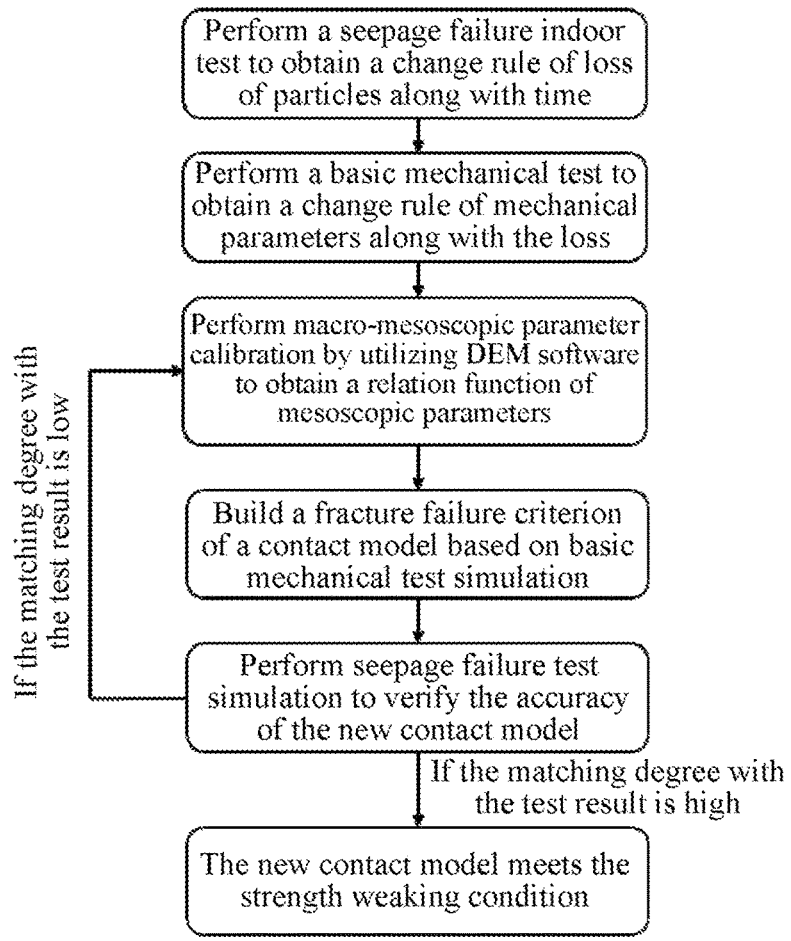
FIG. 1 is a flow chart for building a particle contact model.

It should be noted that the following detailed descriptions are all exemplary and are intended to provide a further understanding of the present invention. Unless otherwise specified, all technical and scientific terms used in the present invention have the same meaning as commonly understood by a person of ordinary skill in the art to which this application belongs.

It should be noted that terms used herein are only for describing specific implementations and are not intended to limit exemplary implementations according to the present invention. As used herein, the singular form is also intended to include the plural form unless the context clearly dictates otherwise. In addition, it should further be understood that, terms "include" and/or "comprise" used in this specification indicate that there are features, steps, operations, devices, components, and/or combinations thereof.

As described in the related art, the continuous medium numerical analysis methods commonly used in the field of geotechnical engineering in the prior art mainly include a finite difference method, a finite element method and a boundary element method. These methods are all based on the assumption of isotropic small deformation of a continuous medium, but a rock and soil mass is an anisotropic body with a large number of discontinuous interfaces such as joint cracks at the inside, so that the discontinuous problem of geotechnical engineering is difficult to solve by using the above methods.

Compared with the continuous medium numerical analysis method, a discrete element method adopts a basic idea of regarding the whole medium as a structure consisting of a series of discrete particles and performing mechanical analysis on the problem on the basis of the force-displacement law and the Newton second motion law, and thus has incomparable advantages in simulating the seepage failure of a rock and soil medium material.

However, a contact model of the discrete element method can only reflect the basic mechanical characteristics of the rock and soil mass under a certain condition, and is difficult to reflect an evolution rule of the mechanical properties in a disaster occurrence process. By taking a tunnel seepage failure water inrush catastrophe evolution process as an example, erosion of seepage on the rock and soil mass causes the shear strength to nonlinearly reduce along with the loss of cohesive soil or fine particles, and the bonding strength in an existing discrete element particle contact model is set to be fixed without considering the nonlinear reduction process of the bonding strength under the seepage of underground water. Therefore, the strength weakening problem of the filling body in the seepage failure evolution process cannot be truly simulated by using the existing model. By aiming at the problem that the existing discrete element numerical simulation method is difficult to realize the simulation of weakening of the internal strength of the rock and soil mass, the present invention provides a discrete element particle contact model building method capable of describing continuous weakening of underground water seepage on rock and soil mass strength, and provides a reasonable and accurate calculation model for simulation of a seepage failure evolution process of the filling body.

A building flow process of the particle contact model of the present invention is as shown in FIG. 1, and specifically includes the following steps:

Step 1: a typical filling body in a disaster-causing structure is selected and prepared into a standard sample of a rock and soil mechanical test, and a seepage failure indoor test under the action of a constant water pressure is performed to obtain a change rule of cumulative loss of the filling body along with time under the action of seepage.

Step 2: a sample is prepared again according to the grading of the filling body after the loss in each time period in step 1, triaxial compression and shearing mechanical tests are respectively performed, and mechanical parameters of the sample in each time period are measured to further obtain a change rule of mechanical parameters of the filling body along with the loss of the filling body.

Step 3: according to the change rules measured in step 1 and step 2, uniaxial tension, triaxial compression and shearing mechanical test simulation is performed by using DEM software, each group of mesoscopic mechanical parameters corresponding to each time period is finally determined, and a relation function of mesoscopic mechanical parameters of a DEM contact model capable of representing the change rule of the macroscopical mechanical parameters of the filling body is obtained.

Step 4: through secondary development of the DEM software contact model, each mesoscopic parameter relation function built in step 3 is embedded into an existing particle contact model, uniaxial compression and triaxial compression test simulation is performed, and a fracture failure criterion of the contact model is updated according to a corresponding relation of macro-mesoscopic strength during model failure, so as to realize the simulation of the continuous weakening process of filling body strength.

Step 5: based on a seepage failure indoor test, a seepage failure discrete element calculation model is built, and the seepage failure process of the rock and soil mass is simulated by using the particle contact model and the fracture criterion of the particle contact model obtained in step 4.

The following further describes the present invention in detail with reference to the accompanying drawings and implementations.

Figure 2:
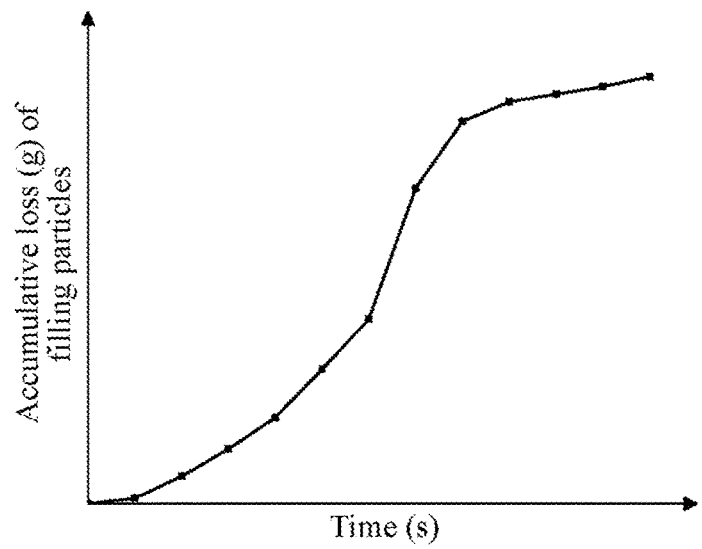
FIG. 2 is a curve of loss change of filling particles along with time.

Firstly, a typical filling body in a disease-causing structure such as a fault, a crushed zone and strong weathered stratum is selected, a particle grading curve of the filling body is determined through screening and weighing, a standard sample of a rock and soil mechanical test is prepared, and a seepage failure indoor test under the action of a constant water pressure is performed by using a seepage test device. At certain time intervals $\Delta t_i$, the filling body flowing out in the test process is collected, dried and weighed, and the mass of the filling body flowing out in each time period is separately weighed, and is sequentially $\Delta m_1, \Delta m_2, \ldots, \Delta m_n$. Along with time accumulation, the mass of the filling body flowing out in the test process is added to obtain the total mass of the filling body flowing out. The change rule (as shown in FIG. 2) of the loss of the filling body along with the time under the action of seepage is obtained. The total mass M of the filling body flowing out in the seepage process is as shown in the following formula:

$$M = \Delta m_1 + \Delta m_2 + \ldots + \Delta_n \quad (1).$$

Figure 3:
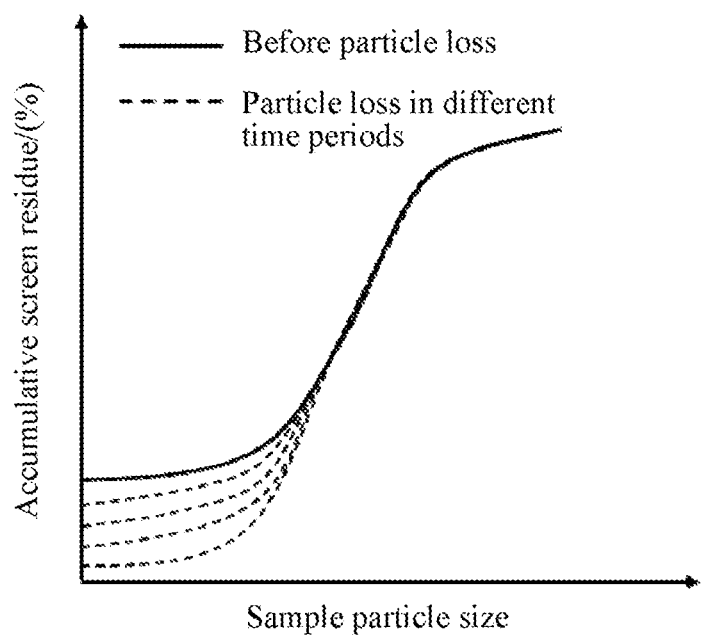
FIG. 3 is a particle grading comparison diagram before and after loss of a filling body.
Figure 4:
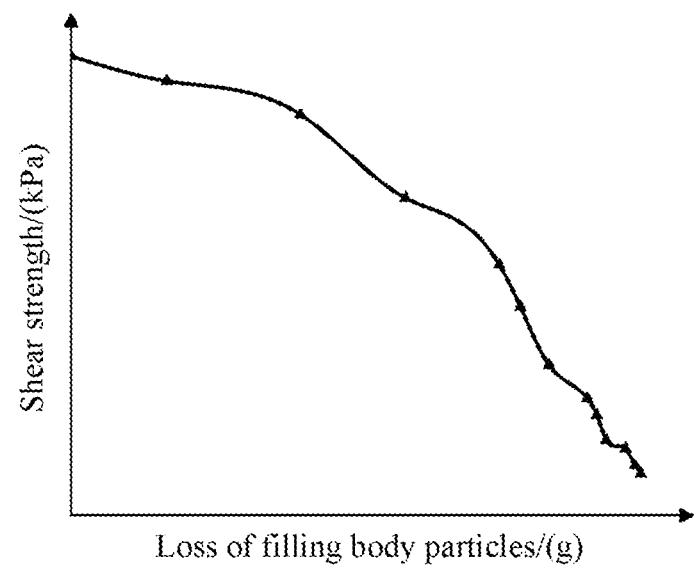
FIG. 4 is a curve of shear strength change of the filling body along with the loss of the particles.

The filling body flowing out in each time period in the above test process is subjected to a screening test after being dried, to measure the grading of the filling body flowing out and further obtain each grading specific weight of the rest filling body in each time period, as shown in FIG. 3. Then, a sample is prepared again according to the grading of the filling body after the loss in each time period. Triaxial compression and shearing mechanical tests are respectively performed, and mechanical parameters such as shear strength $\tau_i$, a compression strength $\sigma_i$, an elastic modulus $E_i$, cohesive force $c_i$ and an internal friction angle $\varphi_i$ (i=1, 2, 3 . . . ) of the sample in each time period are respectively measured to further obtain a change rule (FIG. 4) of each mechanical parameter of the filling body along with the loss of the filling body.

According to the change rule of the loss of the filling body measured in the above steps and the characterization relation of the macroscopic mechanical parameters ($\tau$, $\sigma$, E, c and $\varphi$) of the filling body in each time period along with the loss of the filling medium, the direct tension test, triaxial compression and shear mechanical test simulation is performed by using DEM software. Based on the macroscopical mechanical parameters of the rock and soil mass of each time period in the seepage failure process, macro-mesoscopic parameter calibration is performed by continuously debugging mesoscopic parameters in the numerical simulation, and five mesoscopic parameters, a normal and tangential stiffness ratio (kratio), an effective modulus (pb_deform), a normal bonding strength (pb_ten), a tangential bonding strength (pb_coh) and a parallel bonding friction angle (pb_fa), are mainly calibrated, thus ensuring the model failure mode and the macroscopical mechanical parameters to be basically consistent with the indoor test. The specific implementation steps are as follows:

(1) The elastic modulus in direct tension is calibrated by using direct tension test simulation.

(2) The elastic modulus obtained in (1) is used as an effective modulus (pb_deform) of a parallel bonding model, a transverse strain $\varepsilon_x$ and a longitudinal strain $\varepsilon_y$ of the sample in a compression process are monitored by triaxial compression test simulation at different stiffness ratios, and a Poisson ratio v of the model at different stiffness ratios is solved. A calculation formula of the Poisson ratio is as follows:

$$v = -\frac{\varepsilon_x}{\varepsilon_y}. \quad (2)$$

When the Poisson ratio of the sample at a certain stiffness ratio is identical to an indoor test result, the stiffness ratio (kratio) is the ratio needed in the simulation.

(3) The effective modulus and the stiffness ratio are made to be fixed, and a ratio of the normal bonding strength (pb_ten) and the tangential bonding strength (pb_coh) is adjusted to observe the failure mode of the sample under the triaxial compression condition and the peak stress during model failure, to ensure the failure mode of the sample and the peak stress to be identical to those of the test, and the normal and tangential bonding strength (pb_ten, pb_coh) are finally determined.

(4) Based on the above parameters, triaxial shear test simulation is performed. The parallel bonding friction angle (pb_fa) is adjusted to ensure a simulation shear strength-stress ($\tau$–$\sigma$) curve to be consistent with the indoor test result, and the value of the parallel bonding friction angle parameter is finally determined.

Figure 5:
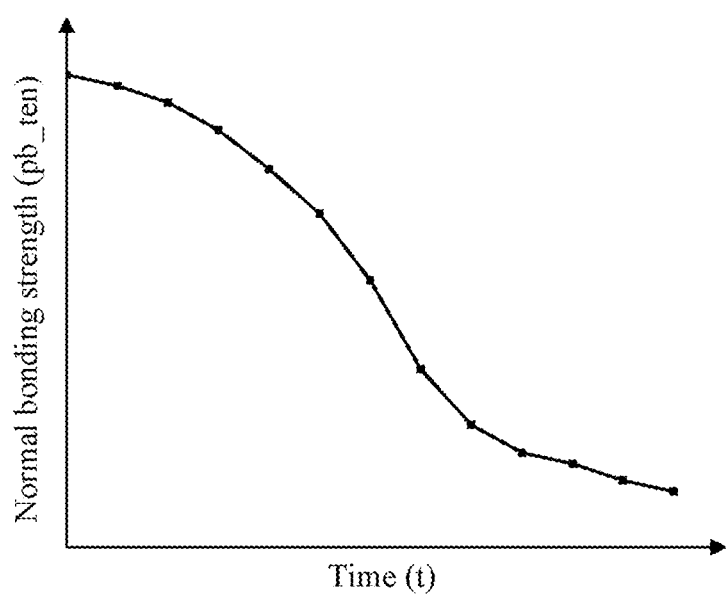
FIG. 5 is a change rule of normal bonding strength along with time.

Based on the above calibration process, a corresponding group of mesoscopic parameters kratio$_i$, pb_deform$_i$, pb_ten$_i$, pb_coh$_i$, and pb_fa$_i$ (i=1, 2, 3 . . . ) is determined according to macroscopic mechanical parameters of each time period. As shown in FIG. 5, by fitting the value of a certain mesoscopic parameter (pb_ten$_1$, pb_ten$_2$, pb_ten$_3$, . . . ) in each time period, a nonlinear change function of the parameter along with time is obtained, the relation between the macroscopic mechanical parameters of the filling body and the mesoscopic parameters of the discrete element contact model is further revealed, and finally, the relation function of each mesoscopic parameter of the DEM contact model capable of representing the change rule of the macroscopic mechanical parameters of the filling body is obtained.

Next, through secondary development of the DEM software contact model, each mesoscopic parameter relation function built in the above steps is embedded into an existing particle contact model. By building uniaxial compression and triaxial compression test simulation, basic mechanical test simulation is performed. According to the corresponding relation of macro-mesoscopic strength during failure, a fracture failure criterion of the contact model is updated, so as to realize the simulation of the continuous weakening process of filling body strength.

The fracture failure criterion of bonds in the particle contact model is as follows:

$$\overline{\sigma} \geq \overline{\sigma}_t(C_{sw}) = \frac{\overline{F}_t(C_{sw})}{A}; \overline{\tau} \geq \overline{c}(C_{sw}) - \overline{\sigma}\tan\overline{\phi}. \qquad (3)$$

In the formula, $\overline{F}_t(C_{sw})$, $\overline{\sigma}_t(C_{sw})$, and $\overline{c}(C_{sw})$ are respectively tension, tensile stress and cohesive force between particles under the condition of certain loss of the filling body; $\overline{\sigma}$, $\overline{\tau}$, and $\overline{\phi}$ are respectively allowable positive stress, allowable shear stress and an internal friction angle; and A is a contact area between particles.

In order to further improve the correctness and applicability of the contact model, the particle contact model obtained in the above steps is used, a numerical model identical to that of a filling seepage indoor test is built to perform filling seepage failure numerical simulation, and the consistency between the interaction of particles in the DEM model and the macroscopic mechanical characteristics of the rock and soil mass is further verified.

The specific implementation steps are as follows:

(1) A numerical model identical to that of a filling seepage indoor test is built by utilizing DEM software, the mesoscopic contact parameters of the particles use mesoscopic parameters calibrated based on the macroscopic parameters of the filling body before seepage failure, and the contact model of the particles uses a new contact model embedded with the relation function of each mesoscopic parameter in the above steps.

(2) The seepage failure indoor test simulation under the action of the constant water pressure is performed. By monitoring the changes of a seepage field, a stress field and a displacement field in the numerical simulation process, the change rule of the bonding strength between the particles along with the time is monitored. At the same time, a filling seepage failure mode and a seepage evolution process are observed and compared with a test result to verify the correctness of the model for simulating the seepage on weakening of the rock and soil mass strength of the filling body.

The DEM particle contact model building method for reflecting the weakening of seepage on the rock and soil mass strength of the filling body is described in detail, the building process of the contact model and the mesoscopic parameter calibration method are illustrated in detail according to the test result, and the correctness of the model for simulating the seepage on weakening of the strength of the filling body is verified through simulation. The descriptions are intended to help to understand the method and the core idea of the present invention. At the same time, for a person of ordinary skill in the art, according to the idea of the present invention, there are changes in the specific implementation and the application scope. In conclusion, the content herein should not be understood as a limitation to the present invention.

The above descriptions are merely exemplary embodiments of the present invention and are not intended to limit the present invention. For a person skilled in the art, the present invention may have various modifications and changes. Any modification, equivalent replacement, or improvement made without departing from the spirit and principle of the present invention shall fall within the protection scope of the present invention.

What is claimed is:

1. A discrete element method (DEM) contact model building method for reflecting weakening of seepage on rock and soil mass strength, comprising the following steps:
    step 1: selecting a filling body in a disaster-causing structure, preparing the filling body into a standard sample of a rock and soil mechanical test, and performing a seepage failure indoor test under a constant water pressure to obtain a change rule of cumulative loss of the filling body along with time under seepage;
    step 2: preparing the standard sample again according to a grading of the filling body after the loss in each time period in step 1, respectively performing triaxial compression and shearing mechanical tests, and measuring mechanical parameters of the sample in each time period to further obtain a change rule of mechanical parameters of the filling body along with the loss of the filling body;
    step 3: according to the change rules obtained in step 1 and step 2, performing uniaxial tension, triaxial compression, and shearing mechanical test simulation by using DEM software, and finally determining each group of mesoscopic mechanical parameters corresponding to each time period; and obtaining a relation function of mesoscopic parameters of the DEM contact model representing a change rule of macroscopical mechanical parameters of the filling body;
    step 4: through secondary development of the DEM contact model, embedding each mesoscopic parameter relation function built in step 3 into an existing particle contact model, performing uniaxial compression and triaxial compression test simulation, and updating a fracture failure criterion of the contact model according to a corresponding relation of macro-mesoscopic strength during model failure, so as to realize the simulation of a continuous weakening process of filling body strength; and
    step 5: based on the seepage failure indoor test, building a seepage failure discrete element calculation model, and simulating a seepage failure process of the rock and soil mass by using the particle contact model and the fracture criterion of the particle contact model obtained in step 4,
    wherein in step 4, a simulation result is compared with a seepage failure indoor test result, and accuracy of the model built is judged by macro-mesoscopic failure mode and mechanical parameter comparison; if a matching degree of the simulation result and the indoor test result is low, the method goes to step 3 to obtain the relation function of the mesoscopic parameters of the DEM contact model representing the change rule of the macroscopical mechanical parameters of the filling body again; and if the matching degree of the simulation result and the indoor test result is high, the simulation result is able to be better matched with the indoor test result by finely adjusting the mesoscopic parameters, so as to indicate a feasibility and accuracy of the strength weakening simulation of the contact model.

2. The DEM contact model building method for reflecting weakening of seepage on rock and soil mass strength according to claim 1, wherein in step 1, at time intervals $\Delta t_i$, the filling body flowing out in the test process is collected, dried and weighed, the mass of the filling body flowing out in each time period is separately weighed, and then, the mass of the filling body flowing out in the test process is added to obtain the total mass of the filling body flowing out.

3. The DEM contact model building method for reflecting weakening of seepage on rock and soil mass strength according to claim 1, wherein in step 2, the filling body flowing out in each time period in step 1 is subjected to a screening test to measure the grading of the filling body flowing out and further obtain each grading specific weight of the rest filling body.

4. The DEM contact model building method for reflecting weakening of seepage on rock and soil mass strength according to claim 1, wherein the mechanical parameters in step 2 comprise a shear strength $\tau$, a compression strength $\sigma$, an elastic modulus E, cohesive force c and an internal friction angle $\varphi$.

5. The DEM contact model building method for reflecting weakening of seepage on rock and soil mass strength according to claim 1, wherein in step 3, based on macroscopical mechanical parameters of the filling body in each time period, macro-mesoscopic parameter calibration is performed, and finally, each group of mesoscopic mechanical parameters corresponding to each time period is determined.

6. The DEM contact model building method for reflecting weakening of seepage on rock and soil mass strength according to claim 1, wherein in step 3, the value of each mesoscopic mechanical parameter in each time period is separately subjected to function fitting, to reveal the relation between the macroscopic mechanical parameters of the filling body and the mesoscopic parameters of a discrete element contact model, and further obtain the relation function of the mesoscopic parameters of the DEM contact model representing the change rule of the macroscopic mechanical parameters of the filling body.

\* \* \* \* \*